United States Patent [19]

Cutchaw

[11] 4,341,432

[45] Jul. 27, 1982

[54] LIQUID COOLED CONNECTOR FOR INTEGRATED CIRCUIT PACKAGES

[76] Inventor: John M. Cutchaw, 7333 E. Virginia Ave., Scottsdale, Ariz. 85257

[21] Appl. No.: 168,392

[22] Filed: Jul. 10, 1980

Related U.S. Application Data

[63] Continuation-in-part of Ser. No. 64,057, Aug. 6, 1979, Pat. No. 4,293,175, which is a continuation-in-part of Ser. No. 913,871, Jun. 8, 1978, Pat. No. 4,166,665, which is a continuation-in-part of Ser. No. 862,582, Dec. 20, 1977, Pat. No. 4,164,003, which is a continuation-in-part of Ser. No. 754,365, Dec. 27, 1976, Pat. No. 4,063,791.

[51] Int. Cl.³ .............................................. H01R 13/00
[52] U.S. Cl. .......................... 339/112 L; 174/16 HS; 361/385; 165/80 C
[58] Field of Search .......... 339/112 R, 112 L, 17 CF; 174/16 HS; 361/385, 386; 165/80 C

[56] References Cited

U.S. PATENT DOCUMENTS

| | | | |
|---|---|---|---|
| 4,012,769 | 3/1977 | Edwards | 174/16 HS |
| 4,166,665 | 9/1979 | Cutchaw | 339/112 L |
| 4,222,090 | 9/1980 | Jaffe | 339/17 CF |
| 4,293,175 | 10/1981 | Cutchaw | 339/75 MP |

*Primary Examiner*—Joseph H. McGlynn
*Assistant Examiner*—Frank H. McKenzie, Jr.
*Attorney, Agent, or Firm*—Herbert E. Haynes, Jr.

[57] ABSTRACT

A liquid cooled connector for mounting and electrically connecting an integrated circuit package on one side of a backpanel, said connector including a thrust/heat dissipating member for placement on the integrated circuit package, a thrust inducing mounting plate for positioning on the opposite side of the backpanel, and complemental elements of a demountable biasing connection passing through the backpanel so as to interconnect the thrust inducing mounting plate and the thrust/heat dissipating member to cause an interaction therebetween which pressurizes the integrated circuit package into conductive contact with the backpanel.

15 Claims, 9 Drawing Figures

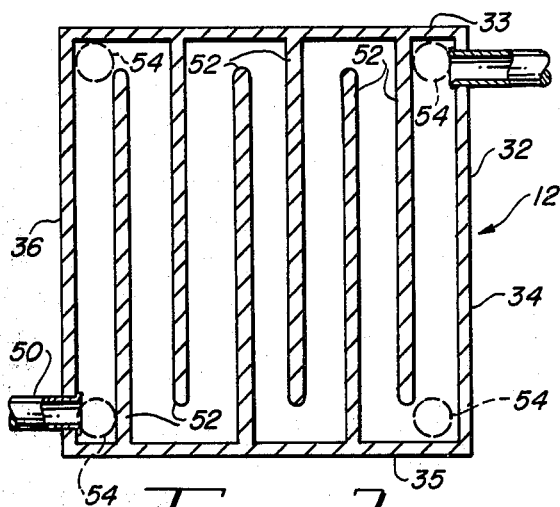
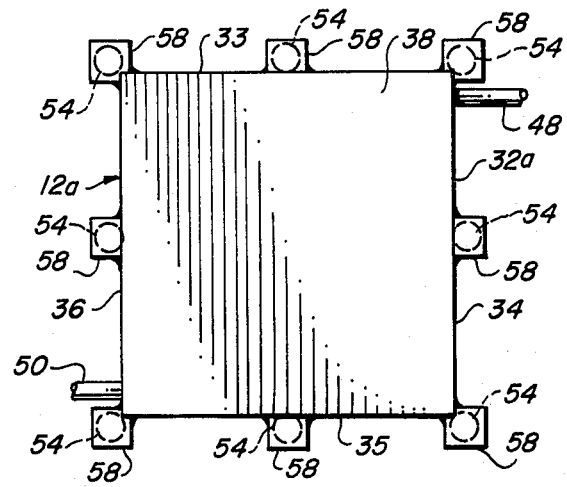
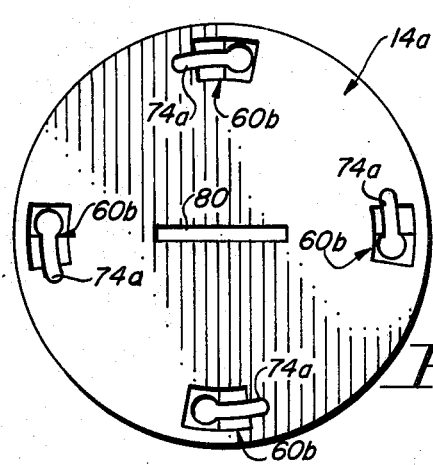
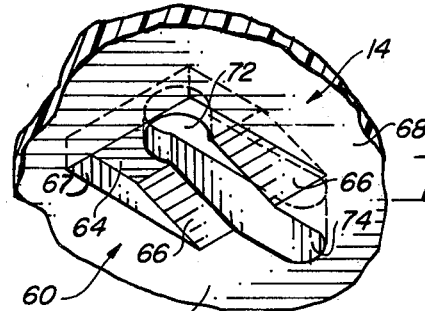
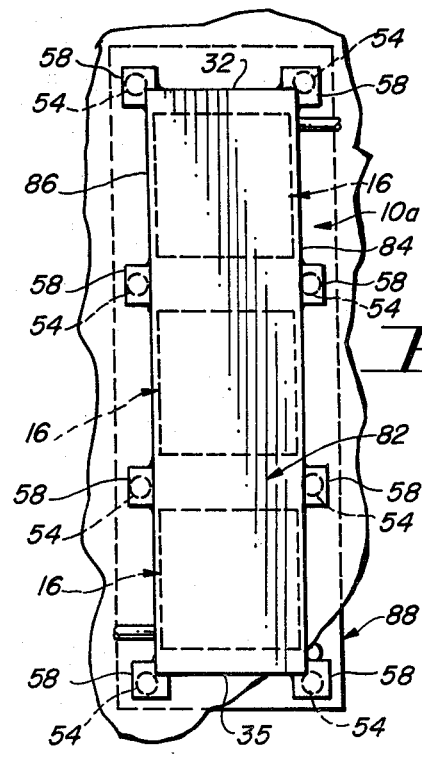
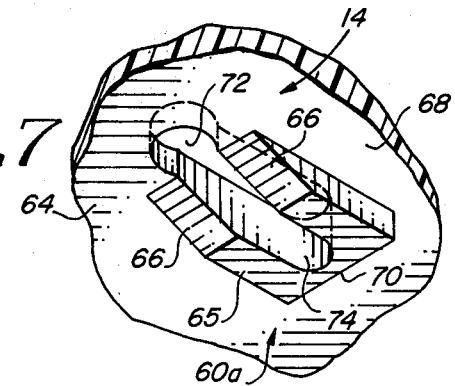
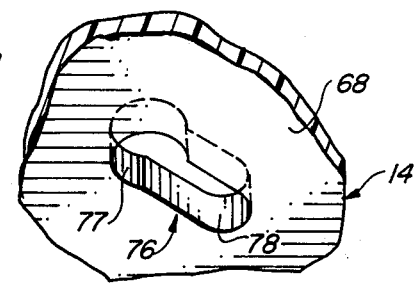

LIQUID COOLED CONNECTOR FOR INTEGRATED CIRCUIT PACKAGES

CROSS-REFERENCE TO RELATED APPLICATIONS

This application is a continuation-in-part of a copending U.S. Pat. Application Ser. No. 64,057, filed Aug. 6, 1979 now U.S. Pat. No. 4,293,175 for: "Connector for Integrated Circuit Packages", which is in turn a continuation-in-part of Ser. No. 913,871, filed 6-8-78, now U.S. Pat. No. 4,166,665 issued on Sep. 4, 1979, which in turn is a continuation-in-part of Ser. No. 862,582, filed 12/20/77, now U.S. Pat. No. 4,164,003, issued on Aug. 7, 1979, and which is in turn a continuation-in-part of Ser. No. 754,365, filed 12/27/76, now filed U.S. Pat. No. 4,063,791 issued on Dec. 20, 1977, all by the same inventor.

BACKGROUND OF THE INVENTION

1. Field of the Invention

This invention relates in general to electrical connectors and more particularly to an electrical connector for demountably coupling an integrated circuit package to a backpanel, with the connector including means for cooling the integrated circuit package.

2. Description of the Prior Art

The need for an improved integrated circuit interconnection technique has become critical from performance and profit standpoints, with the companies who are attempting to use the highly developed microelectronic integrated circuit technology in commercial and consumer applications such as computers, automotive, appliances, communications, industrial components, industrial systems and the like.

This problem stems from the increased packaging densities of the microelectronic integrated circuit packages which require more electrical contacts to couple input-output signals to the integrated circuit chips within the packages. The connectors for physically mounting the integrated circuit packages and electrically interconnecting them into the system in which they are to be used oftentimes are larger and occupy more valuable space than the packages themselves.

Integrated circuit packages of the well known dual-in-line package type (DIP), is a rectangular body with leads extending from the opposite longitudinal edges thereof, and such structures have several problems and shortcomings with regard to the extending leads and the limitations of contact spacing. The leads of the DIP are not strong enough for the manual and mechanical handling which they are receiving as they are being employed in the various applications. Further, since the leads of the DIP are located only on two opposite side edges of the package, the contact spacing is seriously limited. The lead strength problem of the DIP has led to the development of what is referred to as a leadless dual-in-line package, in which terminal pads are provided in place of the extending leads. While this solved the lead strength problem it did not solve the problem of the lack of contact space.

To solve the problem of contact space, an integrated circuit package of square configuration with contacts on all four side edges thereof was developed. These packages, which are sometimes referred to as JEDEC large scale integrated circuit packages, are usually multi-chip carriers having common contact patterns on all edges thereof, and are fabricated as both leaded and leadless structures.

Commercial acceptance of these new packages, i.e., DIP leadless and JEDEC leaded and leadless, has been relatively slow for several reasons, with a particular problem stemming from the connectors for mounting and electrically interconnecting the packages with a backpanel such as a printed circuit board or wiring panel.

Various connector configurations have been employed or suggested for the various integrated circuit packages, with these prior art connectors being relatively costly, bulky, and multipart complex structures. Since the use of terminal pads in the leadless structures dictates, for the most part, that a pressure type of interconnection be employed, the forces needed to achieve reliable connections becomes quite large and can be a serious problem when relatively large numbers of such interconnections are to be made.

One particular prior art connector employs a base which is mounted on the backpanel by soldering or otherwise attaching the wire wrap pins, which depend from the base, into the backpanel. The leadless package is mounted within a recess provided in the base and the terminal pads of the package are pressurized into conductive contact with upwardly extending portions of the wire wrap pins. The necessary downward pressure is accomplished by means of a cover hingedly mounted on the base. This, and similar prior art connectors, are usually employed only on relatively small leadless packages of the type having terminal pads on only two edges thereof due to the inability of such covers to achieve equal pressurization over long spans and on packages having terminal pads on more than two edges.

Another type of prior art connector employs a base, similar to the one described above, for receiving the leadless package. A force exerting element is placed on the leadless package and is pressurized downwardly by means of a cover which is screwed in place. The screws are located only at the corners or ends of such connectors, as determined by the geometric configuration, so as not to sacrifice valuable contact space. Such a mounting technique complicates the servicing and when relatively large leadless packages are mounted in this type of connector, uneven contact pressurization can result in the spans between the mounting screws due to deflection or bowing of the cover and the force exerting element.

A particular prior art connector, which is fully disclosed in U.S. Pat. No. 3,904,262 issued on Sep. 9, 1975, to the same inventor, includes a base receptacle mounted on a backpanel and having contact means therein which are in contact with the backpanel. The receptacle is adapted to receive the circuit package therein so that the terminal pads thereof are in alignment with the contact means provided in the receptacle. A cover is removably mounted in the receptacle and is laterally slidable relative thereto into and out of engagement with inclined plane members formed in the receptacle. When the cover is moved into engagement with the inclined plane members, it will be deflected downwardly and locked in placed to load the terminal pads of the circuit package into conductive contact with the contact means of the base receptacle. This connector, while constituting a substantial improvement in the art has some drawbacks in that the wedging action provided by engagement of the cover with the inclined plane members is exerted only on three sides of the circuit package thus making it possible for unequal pressurization of the terminal pads on the fourth side of the circuit package to occur. Further, this prior art connector requires the use of tooling to accomplish the required lateral sliding of the cover.

Due to the increased packaging density, and other reasons relating to higher switching rates and the like, heat buildup in modern electronic equipment has become a serious problem and cooling of large scale integrated circuit packages is of prime importance. Cooling by natural air convection has given way to forced air cooling in a variety of exotic metallic conduction systems. However, heat dissipation by such forced air systems is limited, and several liquid cooling systems have been developed. These prior art liquid cooling systems are, in general, rather cumbersome mechanisms which contribute significantly to the weight and cost of the electronic equipment.

In view of the foregoing, the need exists for a new and useful liquid cooled connector for large scale integrated circuit packages which overcomes some of the problems of the prior art.

SUMMARY OF THE INVENTION

In accordance with the present invention, a new and improved connector is disclosed for mounting and electrically interconnecting an integrated circuit package and a backpanel, with the connector having means integral therewith for dissipating the heat generated by operation of the integrated circuit package.

The connector of the present invention includes a thrust/heat dissipating member, a thrust inducing mounting plate, and complemental elements of a demountable biased connection formed on the thrust/heat dissipating member and on the thrust inducing mounting plate.

The thrust/heat dissipating member is designed for contiguous placement on one of the planar surfaces of the integrated circuit package for exerting a force thereon which pressurizes the electrical contact means of the integrated circuit package into conductive contact with aligned terminal pads of the backpanel, and is also for carrying away the heat generated by operation of the integrated circuit package. In the preferred embodiment, the thrust/heat dissipating member is configured as a substantially planar fluid tight tank through which liquid coolant is circulatable to accomplish the heat dissipating function. The thrust inducing mounting plate is positionable on the opposite planar surface of the backpanel. The complemental elements of the demountable biased connection, which are provided on the thrust inducing mounting plate and on the thrust/heat dissipating member, are connectable to each other by means of holes provided through the backpanel.

In the preferred embodiment, the thrust/heat dissipating member is provided with plural bosses which extend normally therefrom with the bosses being located at predetermined locations about the periphery of the member. The bosses extend into the holes of the backpanel and each have a headed stud extending axially therefrom so that the studs protrude through the holes of the backpanel. These bosses and headed studs form one half of the complemental elements of the demoutable biased connection. The other half of the complemental elements are in the form of special aperture means formed in the thrust inducing mounting plate, and are located therein so that each of the special aperture means receives a different one of the headed studs therein.

Movement of the thrust inducing mounting plate relative to the backpanel causes an interaction between the headed studs and the special aperture means to pull the thrust/heat dissipating member toward the backpanel and thereby exert a pressurizing force on the integrated circuit package to mount and electrically connect the circuit package to the backpanel.

From the above, it will be appreciated that the connector of the present invention is of exceptionally simple construction in that, as is the case in prior art connectors, the instant connector does not use a base receptable in which the integrated circuit packages are mounted, and the electrical interconnection contacts in those receptacles are not required in the instant connector. By elmination of the base receptacle and the electrical contacts thereof, the connector of the present invention is compatible with all types of backpanels in that the terminal pad arrangements thereof need not be considered in the design of the present connector. The inherent simplicity of the connector of the present invention along with the integral heat dissipating means results in a connector which overcomes many of the problems and shortcomings of the prior art.

Accordingly, it is an object of the present invention to provide a new and useful connector for mounting and electrically connecting an integrated circuit package on a backpanel.

Another object of the present invention is to provide a new and useful connector for mounting and electrically connecting an integrated circuit package on a backpanel and which includes means for dissipation of the heat generated by operation of the integrated circuit package.

Another object of the present invention is to provide a new and useful connector of the above described character which is simple of construction, easy to use, is of minimal size and weight, and is compatible with all types of integrated circuit packages and backpanels.

Another object of the present invention is to provide a new and useful connector of the above described type, with the connector including a thrust/heat dissipating member for engaging the circuit package to exert a force thereon which pressurizes the circuit package into conductive contact with the backpanel and for dissipating the heat produced by operation of the integrated circuit package. The pressurizing force applied by the thrust/heat dissipating member is applied thereto by a thrust inducing mounting plate positioned on the opposite site of the backpanel so that movement thereof relative to the backpanel causes an interaction between the complemental elements of a demountable biased connection which interconnect the thrust/heat dissipating member and the thrust inducing mounting plate via holes formed through the backpanel.

Another object of the present invention is to provide a new and improved connector of the above described character wherein the thrust/heat dissipating member is in the form of a substantially planar fluid tight tank through which liquid coolant is circulatable.

Still another object of the present invention is to provide a new and improved connector of the above described character wherein the complemental elements of a demountable biased connection include plural bosses extending normally from the thrust/heat dissipating member into the holes of the backpanel, with each boss having an axially extending headed stud which protrudes through the holes of the backpanel for interacting engagement with special aperture means formed in the movable thrust inducing mounting plate.

The foregoing and other objects of the present invention, as well as the invention itself, may be more fully understood from the following description when read in conjunction with the accompanying drawings.

BRIEF DESCRIPTION OF THE DRAWINGS

FIG. 3 is a sectional view taken along the line 3—3 of FIG. 2.

FIG. 4 is a plan view of the thrust/heat dissipating member of the liquid cooled connector of the present invention and illustrating a modified form of that member.

FIG. 5 is a bottom view of a modified form of the thrust inducing mounting plate member of the instant connector.

FIG. 6 is an enlarged fragmentary isometric view of a portion of the thrust inducing mounting plate illustrating a first embodiment of a typical one of the special aperture means formed therein.

FIG. 7 is a view similar to FIG. 6 and showing a second embodiment of a typical one of the special aperture means formed in the thrust inducing mounting plate of the connector of the present invention.

FIG. 8 is a view similar to FIGS. 6 and 7 and showing a third embodiment of a typical one of the special aperture means formed in the thrust inducing mounting plate of the connector of the present invention.

FIG. 9 is a plan view, partially broken away, to illustrate a modified configuration of the connector of the present invention which is configured for mounting and electrically connecting a plurality of integrated circuits on a backpanel.

DESCRIPTION OF THE PREFERRED EMBODIMENTS

Figure 1:
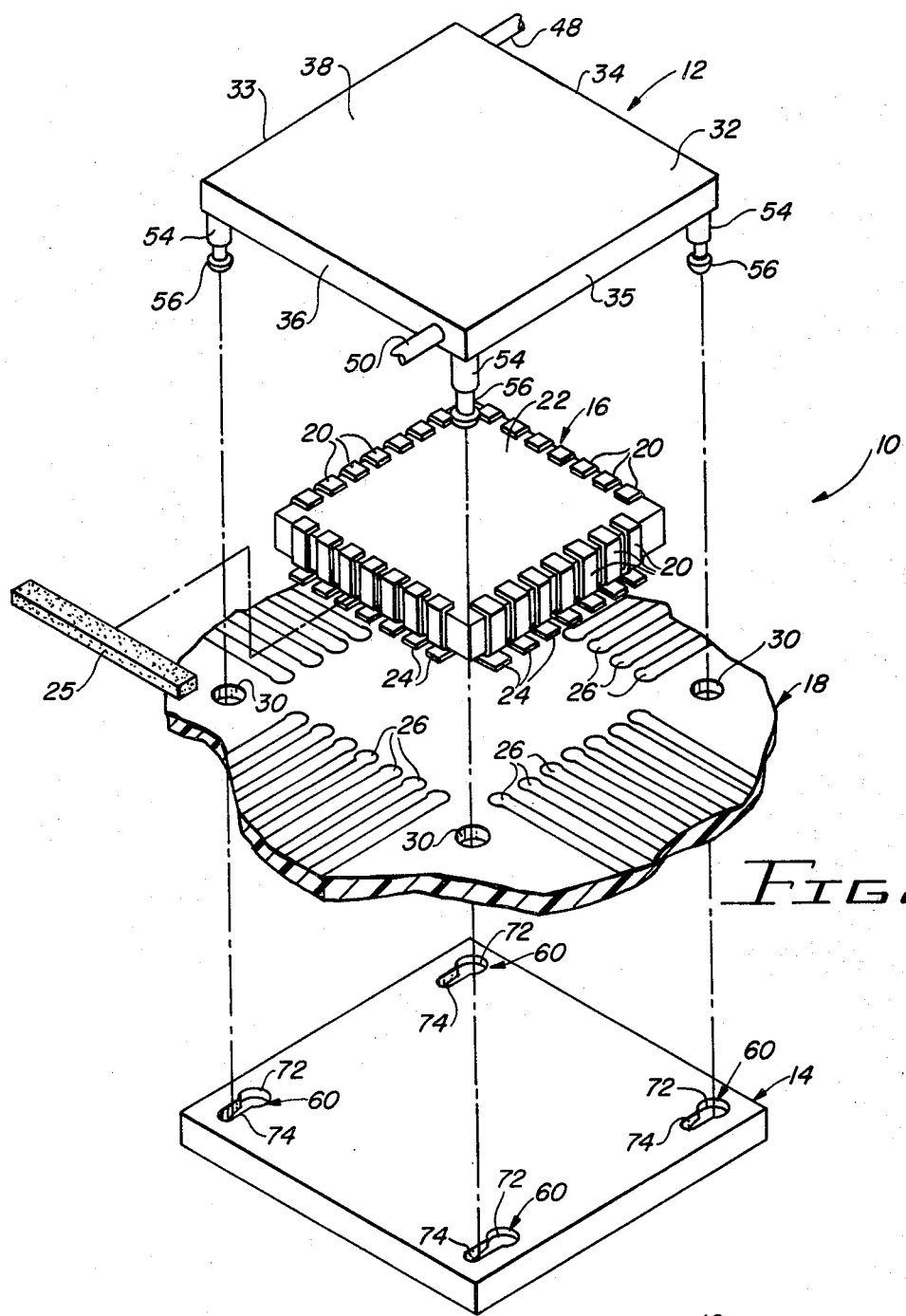
FIG. 1 is an exploded isometric view of the liquid cooled connector of the present invention showing the various features thereof.
Figure 2:
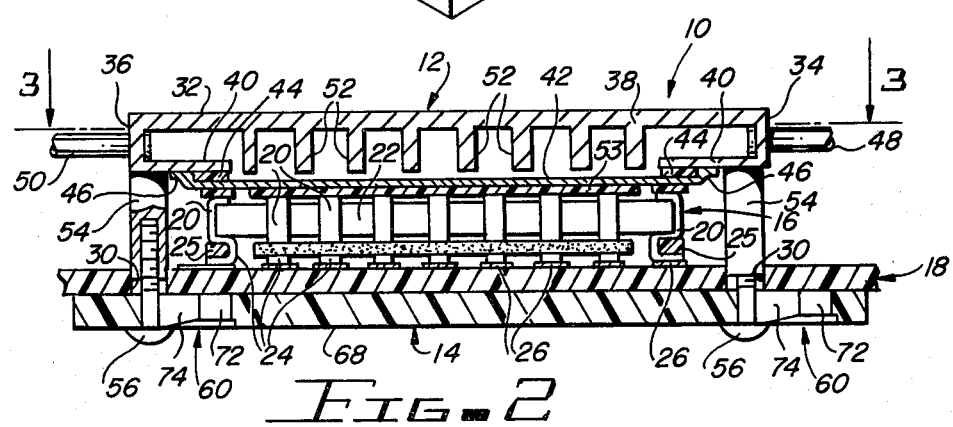
FIG. 2 is a sectional view taken on a vertical plane through the connector which is shown as being fully assembled to mount and electrically interconnect a typical integrated circuit package on a typical backpanel.

Referring more particularly to the drawings, FIGS. 1, 2 and 3 illustrate the preferred embodiment of the liquid cooled connector of the present invention, with the connector being indicated in its entirety by the reference numeral 10. As will hereinafter be described in detail, the connector 10 includes a thrust/heat dissipating member 12, and a thrust inducing mounting plate 14 which cooperate with each other to provide a pressurized mounting and electrical interconnection of an integrated circuit package 16 on a backpanel, and carry away the heat generated by operation of the integrated circuit package.

Although virtually any type of integrated circuit package, such as a leadless dual-in-line circuit package (not shown), may be mounted by the connector 10, the illustrated integrated circuit package 16 is of the type sometimes referred to as a JEDEC large scale integrated circuit package. It is to be understood that JEDEC packages are of various configurations which are broadly divided into the leaded type and the leadless type. In other words, a JEDEC package refers to a family of square packages having a common connector pattern on each of the four peripheral edges thereof.

The particular JEDEC package shown in FIGS. 1 and 2 is illustrative of several types within the JEDEC family, and was shown merely for illustrative purposes. The integrated circuit package 16 has a plurality of leads 20 in the form of spring contacts on each of the peripheral edges of the package body 22. Each of the leads 20 wrap around their respective peripheral edges and have depending spring contact portions 24. Discreet integrated circuits, known as chips (not shown), are mounted within the sealed package body 22, and are electrically interconnected with the leads 20 in a well known manner.

The packpanel 18 is illustrated as being in the form of a printed circuit board of the well known commonly used type, and has terminal pads 26 and their associated conductive runs plated or otherwise formed thereon. The backpanel 18 is provided with holes 30 formed in a predetermined array therethrough for reasons which will become apparent as this description progresses.

The terminal pads 26 of the backpanel 18 are disposed in a geometric array which corresponds to the geometric arrangement of the leads 20 of the integrated circuit package 16. Such corresponding arrays are common in the art so that aligned placement of the circuit package 16 on the packpanel 18 will put each of the leads 20 in engagement with a different one of the terminal pads 26 of the packpanel 18. Such alignment may be accomplished in any of several well known manners, such as by providing guide pins (not shown), or other suitable means for providing precise registered alignment of the circuit package with respect to the backpanel.

The main purpose of the connector 10 of the present invention is to exert a force on the integrated circuit package 16 to pressurize the leads 20 thereof into a gas-tight conductive contact with the terminal pads 26 of the packpanel 18, and thereby provide a demountable interconnection thereof.

It will be appreciated that direct pressure connection of the integrated circuit package 16 on the backpanel 18 is preferred. However, the connector 10 may be employed for mounting and electrically interconnecting an integrated circuit package on a suitable socket device (not shown), or other intermediary mechanism, that is carried on the backpanel.

In any event, the pressure interconnection of the leads 20 with the terminal pads 26 of the backpanel 18, as will be described, can result in contact problems in the absence of some means for maintaining alignment and supporting the extending spring contact portions 24 of the leads 20. First, the leads 20 are very small and rather delicate structures and are positioned on very close centers. Thus, any bending or other displacement of the spring contact portions can cause lead misalignment and/or lead shorting problems. Secondly, overpressurization, equipment vibrations, and the like can cause lead displacement, metal fatigue and other problems which result in contact failure. Therefore, means for maintaining lead alignment and providing support therefor are provided in the form of elongated elastomeric strips 25, as seen best in FIGS. 1 and 2, with each of the elastomeric strips 25 extending between all of the spring contact portions 24 which are aligningly disposed along the different peripheral edges of the integrated circuit package 16, and are fixedly interposed in the loops of each of the spring contact portions 24. The elastomeric strips 25 may be fixedly held in the spring contact portions 24 such as by means of a suitable adhesive (not shown), or may be captively held in the loops by means of the spring contact portions themselves being wrapped part way around the strips (not shown).

The thrust/heat dissipating member 12 is seen to include a planar body 32 of the same basic geometric configuration as the integrated circuit package 16. In the illustrated embodiment, the body 32 is square to match the configuration of the circuit package 16, but it is not intended that the connector 10 of the present invention be limited to that particular shape in that it can be configured to match any package configuration. In any event, the planar body 32 is somewhat larger than the integrated circuit package 16 so that its edges, or sidewalls, 33, 34, 35 and 36 protrude beyond the peripheral edges of the circuit package as seen best in FIG. 2.

As shown in FIGS. 2 and 3, the planar body 32 of the thrust/heat dissipating member 12 is a hollow tank-like structure formed of a suitable heat conductive material, such as metal, with the top wall 38 and the sidewalls 33, 34, 35 and 36, which integrally depend therefrom, being of relatively heavy gage material. The depending ends of the sidewalls 33, 34, 35 and 36 are bent inwardly of the body 32 to form an endless flange 40 which is substantially parallel to the top wall 38 thereof. The bottom wall 42 of the body 32 is formed of relatively thin gage metal, or other heat conductive material, and has its peripheral edges upset as seen in FIG. 2 to provide a space between the downwardly facing surface of the endless flange 40 and the upwardly facing edge surface of the bottom wall 42, with elongated strips of resilient, or elastomeric material 44 being grippingly held in that space. The upset peripheral edges of the bottom wall 42 are soldered or otherwise sealingly affixed to the endless flange 40, as at 46, so that the planar body 32 is a liquid tight structure.

The tank-like planar body 32 of the thrust/heat dissipating member 12 is provided with an inlet conduit 48 sealingly affixed in its sidewall 34 and an outlet conduit 50 similarly affixed in its opposite sidewall 36. The inlet and outlet conduits 48 and 50, respectively, are provided so that liquid coolant (not shown) may be passed under pressure through the hollow body 32 to carry away the heat produced by operation of the integrated circuit package 16 as will hereinafter be described.

The tank-like hollow body 32 is preferably provided with a suitably disposed array of baffles or partitions 52 therein so that the coolant which is movable therethrough will follow a tortuous path for efficient heat transfer purposes. The baffles 52 may be arranged in any suitable array, such as that shown in FIG. 3, and may be integral with, or attached such as by soldering, to the top wall 38 and/or the sidewalls 33, 34, 35 and 36 of the body 32. However, it is preferred that the baffles not be secured to the bottom wall 42 of the planar tank body 32. As a result of the bottom wall 42 being of thin gage material, its being retained only on its peripheral edges, and the elastomeric strips 44, the bottom wall 42 will act as a deflectably movable diaphragm or membrane that will move into contiguous engagement with the upwardly disposed surface of the integrated circuit package 16 when coolant under pressure is flowing through the tank body.

When the particular integrated circuit package has its electric leads disposed in the hereinbefore described edge wrap around manner, as shown, a sheet of suitable dielectric material 53 may be interposed between the thrust/heat dissipating member 12 and the integrated circuit package 16, in the manner shown in FIG. 2, to prevent shorting of the leads 20.

The thrust/heat dissipating member 12 is provided with a boss 54 integrally or otherwise formed at each corner of the tank body 32 and extending normally from the bottom planar surface thereof. A headed stud means 56 extends axially from the free end of each of the bosses 54, and the studs may be in the form of buttonhead screws, or functional equivalents thereof. Each of the studs 56 has a shank portion with an enlarged head on the lower end thereof, and thus provide an upwardly facing flat surface on the head which acts as a shoulder by which the thrust/heat dissipating member 12 is pulled toward the backpanel and held in that position to exert the desired pressurizing force on the integrated circuit package 16. The bosses 54 and the headed stud means 56 form one half of the complemental elements of a demountable biased connection as will hereinafter be described in detail.

As the name implies, and as hereinbefore mentioned, the thrust/heat dissipating member 12 is used to apply a force on the integrated circuit package 16 to mount it on the backpanel 18 and pressurize the leads 20 of the circuit package 16 into conductive contact with the terminal pads 26 of the backpanel. Due to the preferred metallic construction of the thrust/heat dissipating member 12, the force applied thereby will be substantially equally distributed to each of the leads 20 of the circuit package 16. However, to insure that the forces are substantially equally applied to all of the leads 20, which could possible not occur if the thrust/heat dissipating member became bowed, that member may be modified in the manner shown in FIG. 4 wherein the modified thrust/heat dissipating member is identified generally by the reference numeral 12a. In this embodiment, the tank-like body 32a of the thrust/heat dissipating member is reduced in size, i.e., it corresponds approximately to the size of the circuit package 16. Instead of the bosses 54, and their axially extending stud means 56, depending from the bottom surface of the tank body, as was the case in the previously described embodiment, the bosses depend from metal blocks 58 which are suitably affixed, such as by welding, to the corners of the tank body 32a, and additional bosses 54 depend from similar metal blocks 58 which are located on each of the sidewalls 33, 34, 35 and 36 intermediate the opposite ends thereof. The reduction in size of the thrust/heat dissipating member 12a reduces the chances of bowing, and the chances of such bowing are further reduced by inclusion of additional bosses 54 on the sidewalls of the tank body 32a.

In the preferred embodiment shown in FIGS. 1 and 2, the thrust inducing mounting plate 14 is of flat configuration and may be of the same size and shape as the thrust/heat dissipating member 12, or will be somewhat larger in the event that the modified thrust/heat dissipating member 12a is employed, and is preferably formed of a rigid electrically insulative material, such as a suitable plastic. The thrust inducing mounting plate 14 is formed with special aperture means 60 which, as will hereinafter be described, form the other half of the previously mentioned complemental elements of a demountable biased connection, and cooperatively interact with the headed studs 56 for mounting and electrically coupling the circuit package 16 on the backpanel 18.

In the preferred form, each of the aperture means 60 includes a special surface configuration formed in the thrust inducing mounting plate 14. As seen best in FIG. 6, the preferred aperture means comprises an upper surface 64, a lower surface 65 which is laterally spaced from the upper surface, and an inclined plane surface 66, or ramp, which extends between the upper surface 64 and the lower surface 65. As seen, the upper surface 64 is provided by forming a cavity 67 which is recessed upwardly from the lower planar surface 68 of the mounting plate 14, and the lower surface 65 is actually a portion of the lower planar surface 68 of the mounting plate. Although that particular configuration is preferred, FIG. 7 illustrates another method of accomplishing the same objective. In the modified form shown in FIG. 7, the upper surface 64 of the aperture means 60a is actually a portion of the lower planar surface 68 of the mounting plate 14, and the lower surface 65 is provided by molding or otherwise forming a depending pedestal 70 on the mounting plate 14 with the lower surface 65 being the bottom of the depending pedestal 70, and the inclined plane surface 66 forming one side thereof.

In either case, each of the aperture means 60 and 60a further comprise a keyhole shaped aperture formed through the mounting plate 14 with the aperture including an enlarged portion 72 and a laterally extending narrowed slot 74. The enlarged portions 72 of the keyhole apertures open downwardly onto their respective upper surfaces 64 and are sized to be somewhat larger than the heads of the depending stud means 56 so that when the mounting plate 14 is placed in contiguous engagement with the bottom planar surface of the backpanel 18, the depending studs 56, which pass through the holes 30 of the backpanel 18, will each enter into an aligned one of those enlarged portions 72. The narrowed slots 74 of the keyhole apertures each open downwardly onto the inclined plane surface 66 and onto the lower surface 65, and each have a width dimension which is somewhat larger than the diameter of the shanks of the stud means 56 to permit lateral sliding movement of the mounting plate 14 relative to the backpanel 18, as will hereinafter be described in detail.

As seen best in FIG. 1, the narrowed slots 74 of each of the keyhole apertures all extend in the same direction. Thus, when the mounting plate 14 is placed in contiguous engagement with the bottom planar surface of the backpanel 18, the stud means 56 will enter into the aligned aperture means 60 passing downwardly in the enlarged portion 72 as hereinbefore mentioned, and will locate the enlarged heads of the studs 56 below the upper surface 64 of their respective aperture means. Lateral sliding movement of the mounting plate 14 will move the keyhole apertures relative to the studs so that the narrowed slots 74 are moved into straddling positions relative to the shanks of the studs 56. Such movement will bring the inclined plane surfaces 66 into wedged engagement with the upwardly facing shoulders of the studs, and thereby pull the thrust/heat dissipating member 12 downwardly toward the backpanel 18. The downwardly directed force exerted by the thrust inducing mounting plate 14 will bring the spring contact portions 24 of the leads 20 of the integrated circuit package 16 into loaded pressurized conductive contact with the aligned terminal pads 26 of the backpanel 18. When the inclined plane surfaces 66 of the aperture means 60 have passed completely above the heads of the studs 56, the shoulders of the studs will bear against the lower surfaces 65 and therefore, the thrust/heat dissipating member 12 will be lockingly held in the downwardly pulled direction.

It should be noted that the inclined plane surfaces 66 should be configured with a length to height ratio of at least three to one (3 to 1) and preferably five to one (5 to 1), to provide a mechanical advantage that is high enough to facilitate lateral sliding movement of the thrust inducing mounting plate 14.

Reference is now made to FIG. 8 wherein a typical one of a third form of aperture means 76 is shown. In this embodiment, the aperture means 76 includes only the keyhole apertures which pass completely through the mounting plate 14, and has an enlarged portion 77 and an extending narrowed slot 78. When the mounting plate 14 is configured with the aperture means 76, mounting thereof is accomplished by placing the mounting plate 14 in contiguous engagement with the bottom surface of the backpanel 18, with the stud means 56 entering into the enlarged portions 77 of their respectively aligned ones of the aperture means 76. The thrust/heat dissipating member 12 is then pressed toward the surface of the backpanel 18, such as by hand, to compress the spring contact portions 24 of the leads 20 of the integrated circuit package 16, which causes the heads of the studs 56 to move below the lower surface 68 of the mounting plate 14. Then the mounting plate 14 is laterally moved, as hereinbefore described, so that the narrowed slots 78 will move into a position where they straddle the shanks of their respective studs 56. When this lateral movement of the thrust inducing mounting plate is completed, the integrated circuit package 16 is released and the resilient spring contact portions 24 of the leads 20 will move the integrated circuit package 16 away from the backpanel 18 and thus bring the shoulders of the studs 56 into locked bearing engagement with the lower surface of the mounting plate.

Although the above described thrust inducing mount plate 14 is preferred, it may be in alternate forms. For example, the plate 14 need not be a solid structure of the type shown best in FIG. 1, but could be of a square ring-like configuration (not shown) for weight reduction purposes.

A modified form of thrust inducing mounting plate is illustrated in FIG. 5 and is identified in general by the reference numeral 14a. The plate 14a is of circular shape and is provided with a blind slot 80 centrally in the bottom planar surface thereof. The aperture means 60b formed in the plate 14a, are similar to the previously described aperture means 60, 60a, or 76, except that the extending narrowed slots 74a thereof are arcuate. In use, the thrust inducing mounting plate 14a is rotated to produce the interaction of the aperture means 60b with the headed stud means 56 (FIG. 1) rather than moved laterally as was the case in the previously described thrust inducing mounting plate 14. Such rotational movement of the plate 14a may be accomplished manually, or a bladed tool (not shown), such as a screw driver, may be inserted into the blind slot 80 to facilitate the rotational movement.

Reference is now made to FIG. 9 wherein a modified version of the connector of the present invention is shown, with this connector being indicated in its entirety by the numeral 10a. As seen, the thrust/heat dissipating member 82 is of rectangular configuration, and, with the exception of additional metal blocks 58 and depending bosses 54 on the elongated sidewalls 84 and 86, it is identical to the hereinbefore described member 12a.

The elongated rectangular configuration of the thrust/heat dissipating member 82 allows the single connector 10a to mount and electrically interconnect an aligned plurality of integrated circuit packages 16 on the backpanel 18. The thrust/inducing mounting plate 88 is also of rectangular configuration and is otherwise identical to the previously described thrust inducing mounting plate 14.

While the principles of the invention have now been made clear in illustrated embodiments, there will be immediately obvious to those skilled in the art, many modifications of structure, arrangements, proportions, the elements, materials, and components used in the practice of the invention, and otherwise, which are particularly adapted for specific environments and operation requirements without departing from those principles.

For example, the complemental elements of a demountable biased connection may include screws (not shown) which pass through the thrust inducing mounting plate and the backpanel into threaded engagement with the depending bosses. Further, in some instances, it may be desired to replace the liquid cooling tank configuration of the thrust/heat dissipating member 12 with a flat plate having heat radiating fins (not shown) extending normally therefrom.

The appended claims are therefore intended to cover and embrace any such modifications within the limits only of the true spirit and scope of the invention.

What I claim is:

1. A connector for removably mounting and electrically connecting an integrated circuit package on a backpanel and dissipating the heat generated by operation of the integrated circuit package, the backpanel having holes formed therethrough, said connector comprising:
   (a) a thrust/heat dissipating member of substantially planar configuration for placement in overlaying engagement with the integrated circuit package and movable toward the backpanel for exerting a force on the integrated circuit package to pressurize the leads thereof into conductive contact with aligned terminal pads of the backpanel when the integrated circuit package is aligningly positioned thereon, said thrust/heat dissipating member having means for absorbing and dissipating the heat generated by operation of the integrated circuit package;
   (b) a thrust inducing mounting plate for positioning in contiguous engagement with the opposite surface of the backpanel; and
   (c) complemental elements of a demountable biased connection on said thrust/heat dissipating member and on said thrust inducing mounting plate for interconnection thereof through the holes of the backpanel to move said thrust/heat dissipating member toward the backpanel for pressurized mounting and electrical connection of the integrated circuit package on the backpanel.

2. A connector as claimed in claim 1 wherein said thrust/heat dissipating member is a fluid tight tank through which liquid coolant under pressure is movable.

3. A connector as claimed in claim 2 wherein said thrust/heat dissipating member includes flow directing means therein for forming a tortuous path for the liquid coolant which is movable therethrough.

4. A connector as claimed in claim 1 wherein said thrust/heat dissipating member comprises:
   (a) a rigid metallic top of planar configuration;
   (b) rigid metallic sidewalls integral with said top and endlessly depending from the perimeter thereof;
   (c) a bottom of planar configuration and formed of deformably resilient relatively thin gage metal, said bottom having its peripheral edges sealingly affixed to the depending perimeter of said endless sidewall to form a fluid tight chamber; and
   (d) means through which liquid coolant under pressure is circulatingly movable through the fluid tight chamber defined by said top, said sidewalls and said bottom.

5. A connector as claimed in claim 4 wherein said thrust/heat dissipating member further comprises:
   (a) said metallic sidewalls bent inwardly at their depending ends to form an endless flange which is substantially parallel with respect to said top;
   (b) said bottom having its peripheral edges upset to form a space between the downwardly facing surface of the endless flange and the upwardly facing surface of said bottom; and
   (c) a strip of resilient material in the space between said endless flange and said bottom.

6. A connector as claimed in claim 4 wherein said thrust/heat dissipating member further comprises baffles within the fluid tight chamber defined by said top, said sidewalls and said bottom to form a tortuous path for the liquid coolant movable therethrough.

7. A connector as claimed in claim 1 wherein said complemental elements of a demountable biased connection comprises:
   (a) a plurality of bosses on said thrust/heat dissipating member in substantially equally spaced increments about the periphery thereof and disposed to extend normally from one of the planar surfaces thereof, said bosses positionable in axially aligned relationship with the holes in the backpanel when said thrust/heat dissipating member is positioned in overlaying engagement with the integrated circuit package;
   (b) stud means extending axially from each of said bosses so as to extend through the holes of the backpanel when said thrust/heat dissipating member is positioned in overlaying engagement with the integrated circuit package;
   (c) a plurality of aperture means formed through said thrust inducing mounting plate with each receiving a different one of said stud means when said thrust/heat dissipating member is in overlaying engagement with the integrated circuit package and said thrust inducing mounting plate is positioned on the opposite side of the packpanel; and
   (d) said thrust inducing mounting plate being movable on the opposite surface of the backpanel for causing an interaction between said stud means and said aperture means to move said thrust/heat dissipating member toward said backpanel to mount and electrically connect the integrated circuit package on the backpanel.

8. A connector as claimed in claim 7 wherein said plurality of aperture means formed in said thrust inducing mounting plate each comprises:
   (a) a lower surface formed on said thrust inducing mounting plate;
   (b) an upper surface formed on said thrust inducing mounting plate and laterally spaced from said lower surface;

(c) an inclined plane surface extending angularly between said lower surface and said upper surface; and (d) said thrust inducing mounting plate having a keyhole shaped aperture formed therethrough, said aperture having an enlarged portion which opens downwardly onto said upper surface and having a narrowed slot which opens downwardly onto said inclined plane surface and onto said lower surface.

9. A connector as claimed in claim 7 wherein said plurality of aperture means formed in said thrust inducing mounting plate each comprises:
(a) an upper surface formed in the top of a recessed cavity provided in the lower planar surface of said thrust inducing mounting plate;
(b) an inclined plane surface formed in said thrust inducing mounting plate so as to extend laterally angularly and downwardly from said upper surface to the lower planar surface of said thrust inducing mounting plate; and
(c) said thrust inducing mounting plate having a keyhole shaped aperture formed therethrough, said aperture having an enlarged portion which opens downwardly onto said upper surface and having a narrowed slot which opens downwardly onto said inclined plane surface and onto the lower planar surface of said mounting plate.

10. A connector as claimed in claim 7 wherein said plurality of aperture means formed in said thrust inducing mounting plate each comprises:
(a) a depending pedestal formed on said thrust inducing mounting plate and having a lower surface;
(b) an inclined plane surface extending laterally angularly and upwardly from said lower surface of said pedestal to the lower planar surface of the thrust inducing mounting plate; and
(c) said thrust inducing mounting plate having a keyhole shaped aperture formed therethrough, said aperture having an enlarged portion which opens downwardly onto the lower planar surface of said thrust inducing mounting plate adjacent said inclined plane surface and having a narrowed slot which opens downwardly onto said inclined plane surface and onto the lower surface of said pedestal.

11. A connector as claimed in claim 7 wherein each of said stud means comprises:
(a) a shank portion extending axially from its respective one of said bosses; and
(b) an enlarged head on the extending end of said shank.

12. A connector as claimed in claim 7 and further comprising:
(a) each of said stud means including,
   I. a shank portion extending axially from its respective one of said bosses,
   II. an enlarged head on the extending end of said shank; and
(b) each of said aperture means formed in said thrust inducing mounting plate being of keyhole shaped configuration and extending through said thrust inducing mounting plate, said keyhole shaped aperture having an enlarged portion for receiving said enlarged head of said stud means and having a narrowed slot which straddles said shank when said thrust inducing mounting plate is positioned on the opposite surface of the backpanel and is moved thereon.

13. A connector as claimed in claim 7 wherein said thrust inducing mounting plate is laterally slidably movable on the opposite side of said backpanel for producing the interaction between said stud means and said aperture means.

14. A connector as claimed in claim 7 wherein said thrust inducing mounting plate is rotatably movable on the opposite side of said backpanel for producing the interaction between said stud means and said aperture means.

15. A connector as claimed in claim 14 wherein said thrust inducing mounting plate is provided with a blind slot centrally thereof into which a tool is insertable to facilitate rotational movement of said thrust inducing mounting plate.

* * * * *